(12) United States Patent
Sakurada et al.

(10) Patent No.: US 8,147,611 B2
(45) Date of Patent: Apr. 3, 2012

(54) METHOD OF MANUFACTURING SINGLE CRYSTAL

(75) Inventors: Masahiro Sakurada, Fukushima (JP); Izumi Fusegawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1114 days.

(21) Appl. No.: 11/988,295

(22) PCT Filed: Apr. 27, 2006

(86) PCT No.: PCT/JP2006/308814
§ 371 (c)(1),
(2), (4) Date: Jan. 4, 2008

(87) PCT Pub. No.: WO2007/007456
PCT Pub. Date: Jan. 18, 2007

(65) Prior Publication Data
US 2010/0126409 A1  May 27, 2010

(30) Foreign Application Priority Data

Jul. 13, 2005 (JP) .................. 2005-204207

(51) Int. Cl.
*C30B 15/20* (2006.01)
(52) U.S. Cl. .................. 117/32; 117/13; 117/15; 117/30

(58) Field of Classification Search .................... 117/32, 117/30, 13, 15
See application file for complete search history.

(56) References Cited

U.S. PATENT DOCUMENTS

| | | | |
|---|---|---|---|
| 6,190,452 B1 * | 2/2001 | Sakurada et al. .............. 117/20 |
| 6,458,204 B1 * | 10/2002 | Okui et al. ...................... 117/30 |
| 6,726,764 B2 * | 4/2004 | Mutti et al. ...................... 117/14 |
| 2003/0041796 A1 * | 3/2003 | Nakamura et al. .............. 117/13 |
| 2004/0107894 A1 * | 6/2004 | Shimonosono et al. ........ 117/30 |

FOREIGN PATENT DOCUMENTS

| | | |
|---|---|---|
| JP | A-11-199386 | 7/1999 |
| JP | A-2004-315289 | 11/2004 |

* cited by examiner

*Primary Examiner* — Bob M Kunemund
(74) *Attorney, Agent, or Firm* — Oliff & Berridge, PLC

(57) ABSTRACT

A method of manufacturing a single crystal based on a Czochralski method of applying a horizontal magnetic field, wherein the single crystal is pulled in such a manner that a radial magnetic field intensity gradient $\Delta Br/\Delta Rc$ in a direction connecting central points of magnetic field generation coils exceeds 5.5 (Gauss/mm) and becomes 10 (Gauss/mm) or below where an origin O is a central part of the single crystal on a solid-liquid interface, $\Delta Br$ (Gauss) is a variation in a magnetic field intensity from the origin O to a crucible inner wall on a surface of a melt, and $\Delta Rc$ (mm) is a radial distance from the origin O to the crucible inner wall on the surface of the melt.

18 Claims, 2 Drawing Sheets

METHOD OF MANUFACTURING SINGLE CRYSTAL

TECHNICAL FIELD

The present invention relates to a method of manufacturing a single crystal based on a Czochralski method of applying a magnetic field, and more particularly to a method of keeping a fluctuation in a temperature gradient near a crystal solid-liquid interface with time when pulling a single crystal to a minimum and manufacturing a silicon single crystal having a desired defect region formed in a crystal growth direction with high productivity and a high production yield.

BACKGROUND ART

As a single crystal used as a semiconductor device substrate, there is, e.g., a silicon single crystal, and it is manufactured mainly based on a Czochralski (CZ) method. Although high integration of a semiconductor device advances in recent years, a problem of a grown-in defect which is introduced during growth of the silicon single crystal based on the CZ method is becoming serious with this high integration.

FIG. 2 is a distribution map of this grown-in defect.

As shown in FIG. 2, as the grown-in defect, there is a vacancy type defect caused due to a void, e.g., a FPD (Flow Pattern Defect) or a COP (Crystal Originated Particle) formed when a pulling rate F (mm/min) is relatively high, and a region where such a defect is present is called a V region. Further, an OSF (Oxidation Induced Stacking Fault) occurs with a reduction in the pulling rate F (mm/min). Furthermore, there is a defect having interstitial silicon agglomerated therein which is considered as a factor of a dislocation loop, e.g., an LSEPD (Large Secco Etch Pit Defect) or an LFPD (Large Flow Pattern Defect) which occurs at a low pulling rate F (mm/min), and a region where such a defect is present is called an I region.

It was recently discovered that an N region having no defect mentioned above is present between the V region where the FPD or the COP is present and the I region where the LSEPD or the LFPD is present outside an OSF ring. Further classifying this region, there are a vacancy type Nv region and an Ni region having a large amount of the interstitial silicon, and it is known that an amount of precipitated oxygen is large in the Nv region when thermal oxidation processing is performed and that oxygen precipitation hardly occurs in the Ni region.

Moreover, it is also known that a Cu deposition defect region having a defect detected by Cu deposition treatment is present in a part of the Nv region where oxygen precipitation is apt to occur after thermal oxidation processing.

Here, the Cu deposition treatment means processing of applying a electric potential to an oxide film formed on a wafer surface in a liquid in which a Cu ion is dissolved, and a current flows through a part where the oxide film is degraded and the Cu ion is precipitated as Cu. Additionally, it is known that a defect is present in this part where the oxide film is apt to be degraded. A defective part of a wafer subjected to the Cu deposition treatment can be analyzed under a collimated light or with the naked eye directly to evaluate its distribution or density, and it can be also confirmed based on microscopic observation using, e.g., a transmission electron microscope (TEM) or a scanning electron microscope (SEM).

In manufacture of a single crystal based on the CZ method, it is considered that an introduction amount of the above-explained grown-in defect is determined by a parameter called $F/Gc$ ($mm^2/°C.\cdot min$). That is, adjusting the pulling rate F (mm/min) and a crystal temperature gradient Gc (° C./mm) near a solid-liquid interface of a central part of a crystal in such a manner that $F/Gc$ ($mm^2/°C.\cdot min$) becomes constant enables pulling the single crystal with a desired defect region.

However, when a heat convection of a melt fluctuates and an intensive time fluctuation occurs in a temperature near the crystal solid-liquid interface during an operation of pulling the single crystal, the crystal temperature gradient Gc (° C./mm) near the solid-liquid interface of the central part of the crystal is not stabilized, and a ratio of the pulling rate F (mm/min) and the crystal temperature gradient Gc (° C./mm) near the solid-liquid interface of the central part of the crystal, i.e., $F/Gc$ ($mm^2/°C.\cdot min$) varies with time. Further, when a temperature near the crystal solid-liquid interface fluctuates, a diameter of the single crystal to be pulled varies, the pulling rate F (mm/min) must be changed to suppress this fluctuation, and hence an amplitude range thereof is increased. Furthermore, when such a considerable time fluctuation occurs during growth of the large-diameter silicon single crystal having a diameter of 200 mm or above in particular, this becomes an obstacle to prevent a desired crystal defect distribution from being formed in the crystal growth direction.

For example, in case of controlling the pulling rate F (mm/min) in the N region having a narrow crystal manufacture margin to pull the silicon single crystal, when such a remarkable time fluctuation occurs in a temperature near the crystal solid-liquid interface, a region other than the N region, e.g., the V region, the OSF region, or the I region may be formed in the crystal growth direction in some cases. Moreover, a wafer sliced from such a crystal may have a problem of considerably degrading electrical characteristics. Therefore, a heat convection of the melt must be suppressed, and a desired crystal defect region must be uniformly formed in the crystal growth direction.

Thus, as a method of suppressing the heat convention of the melt and reducing a time fluctuation in a temperature of the single crystal to be pulled near the solid-liquid interface (a temperature near a melt surface), an MCZ method, e.g., a horizontal magnetic field application CZ method (an HMCZ method) of arranging magnetic field application devices each including an electromagnet, e.g., a superconducting magnet to face each other with a crucible sandwiched therebetween on the outer side of the heater for heating the crucible has been adopted.

For example, Japanese Patent Application Laid-open No. 2004-315289 discloses a method of setting a minimum magnetic field intensity in a melt to 2000 G or above, setting a maximum magnetic field intensity in the melt to 6000 G or below, and setting a maximum magnetic field gradient obtained by dividing a difference between the maximum and minimum magnetic field intensities by a distance thereof to 55 G/cm or below.

However, in order to manufacture a single crystal having a desired crystal defect formed in a growth direction with high productivity and a high production yield, these conventional manufacturing methods are insufficient, and further improvements are desired.

Additionally, in recent years, when a large-diameter silicon single crystal having a diameter of 300 mm is to be pulled with the N region, a growth rate must be increased, and productivity must be heightened. Thus, like the example of pulling a silicon single crystal having a diameter of 200 mm with the N region, a measure of reducing a length of a gas flow-guide cylinder to further rapidly perform cooling is taken. However, in a hot zone (an in-furnace structure) having such a rapid cooling structure, solidification disadvantageously very often occurs during crystal growth. Occurrence of such solidification is an obstacle for single-crystallization and leads to a reduction in a production yield of the N-region single crystal.

DISCLOSURE OF INVENTION

In view of the above-explained problems, it is an object of the present invention to provide a method of manufacturing a single crystal, which can keep a fluctuation in a temperature gradient near a solid-liquid interface with time to a minimum when growing a single crystal and can readily manufacture the high-quality single crystal having a desired defect region formed in a crystal growth direction with high productivity and a high production yield.

In order to solve the above-explained problems, according to the present invention, there is provided a method of manufacturing a single crystal based on a Czochralski method of applying a horizontal magnetic field, wherein the single crystal is pulled in such a manner that a radial magnetic field intensity gradient $\Delta Br/\Delta Rc$ in a direction connecting central points of magnetic field generation coils is set to exceeds 5.5 (Gauss/mm) and becomes 10 (Gauss/mm) or below where an origin O is a central part of the single crystal on a solid-liquid interface, $\Delta Br$ (Gauss) is a variation in a magnetic field intensity from the origin O to a crucible inner wall on a surface of a melt, and $\Delta Rc$ (mm) is a radial distance from the origin O to the crucible inner wall on the surface of the melt.

As explained above, in case of growing a single crystal based on the Czochralski method of applying a horizontal magnetic field, when the radial magnetic field intensity gradient $\Delta Br/\Delta Rc$ in the direction connecting the central points of the magnetic field generation coils is set to exceed 5.5 (Gauss/mm) and become 10 (Gauss/mm) or below, a convection of a raw material melt can be reasonably suppressed, and a time fluctuation in a temperature near the crystal solid-liquid interface can be kept to a minimum. Further, since a crystal temperature gradient Gc (mm$^2$/° C.·min) at the central part of the crystal near the solid-liquid interface can be consequently stabilized and a fluctuation in a diameter of the single crystal to be pulled can be kept to a minimum, a pulling rate F (mm/min) can be also stabilized, thereby readily manufacturing the single crystal having a desired defect region formed in the crystal growth direction. Furthermore, solidification during pulling the single crystal as a factor obstructing single-crystallization, which is a problem in a hot zone having a rapid cooling structure in particular, can be sufficiently suppressed from occurring. Therefore, the single crystal having a desired defect region can be easily manufactured with high productivity and a high production yield.

Moreover, in the method of manufacturing a single crystal according to the present invention, it is preferable that a magnetic field intensity Bo at the origin O of the central part of the crystal solid-liquid interface is set to fall within the range of 2500 (Gauss) to 5500 (Gauss) when pulling the single crystal.

When the magnetic field intensity at the origin O of the central part of the crystal solid-liquid interface is set to fall within the optimum range in this manner, the single crystal having a desired defect region can be pulled at a high growth speed. As a result, productivity of the single crystal having the desired defect region can be improved.

Additionally, according to the method of manufacturing a single crystal of the present invention, since a time fluctuation in a temperature near the crystal solid-liquid interface can be kept to a minimum, an average value of a pulling rate F (mm/min) can be controlled to fall within the range of ±0.01 (mm/min) with respect to an average value of a critical rate at which an OSF is annihilated at a center of a crystal bulk and a diameter of the single crystal which is in a pulling operation can be controlled to fall within the range of ±1% of a target value when pulling the single crystal. That is, the single crystal having the N region can be easily and stably manufactured in the crystal growth direction.

Further, in the method of manufacturing a single crystal according to the present invention, it is preferable that a ratio F/Gc (mm$^2$/° C.·min) of the pulling rate F (mm/min) and a crystal temperature gradient Gc (° C./mm) of a crystal central part near the solid-liquid interface is controlled and a difference $\Delta G=|Gc-Ge|$ between the temperature gradient Gc (° C./mm) of the crystal central part near the solid-liquid interface and a temperature gradient Ge (° C./mm) of a crystal peripheral part near the solid-liquid interface is controlled to become 5° C./mm or below, in such a manner that the single crystal to be pulled has a desired defect region.

Reducing the ratio F/Gc (mm$^2$/° C.·min) of the pulling rate F (mm/min) and the crystal temperature gradient Gc (° C./mm) of the central part of the crystal near the solid-liquid interface as well as the difference $\Delta G$ between the temperature gradient Gc (° C./mm) of the central part of the crystal near the solid-liquid interface and the temperature gradient Ge (° C./mm) of the peripheral part of the crystal near the solid-liquid interface enables further readily manufacturing the single crystal having the desired defect region in the crystal diameter direction.

Furthermore, in the method of manufacturing a single crystal according to the present invention, a crucible, which contains the melt and has a diameter of 24 inches (600 mm) or above can be used.

According to the present invention, even in case of a large-diameter single crystal, which is pulled by using such a large-diameter crucible, a fluctuation in the diameter of the single crystal during a crystal pulling operation can be kept to a minimum, thereby reducing an amplitude range of a growth rate.

Moreover, in the method of manufacturing a single crystal according to the present invention, the single crystal is silicon.

As explained above, the method of manufacturing a single crystal according to the present invention can be preferably used when manufacturing a silicon single crystal whose diameter is prominently increased in recent years.

As explained above, according to the present invention, in the Czochralski method of applying a horizontal magnetic field, since the single crystal is pulled in such a manner that the radial magnetic field intensity gradient $\Delta Br/\Delta Rc$ in the direction connecting the central points of the magnetic field generation coils exceeds 5.5 (Gauss/mm) and becomes 10 (Gauss/mm) or below, the single crystal having the desired defect region in the crystal growth direction can be easily manufactured. Moreover, solidification during the single-crystal pulling operation which is a factor obstructing single-crystallization can be sufficiently prevented from occurring. Therefore, the single crystal having the desired defect region can be manufactured with high productivity and a high production yield.

BEST MODE(S) FOR CARRYING OUT THE INVENTION

Figure 1:
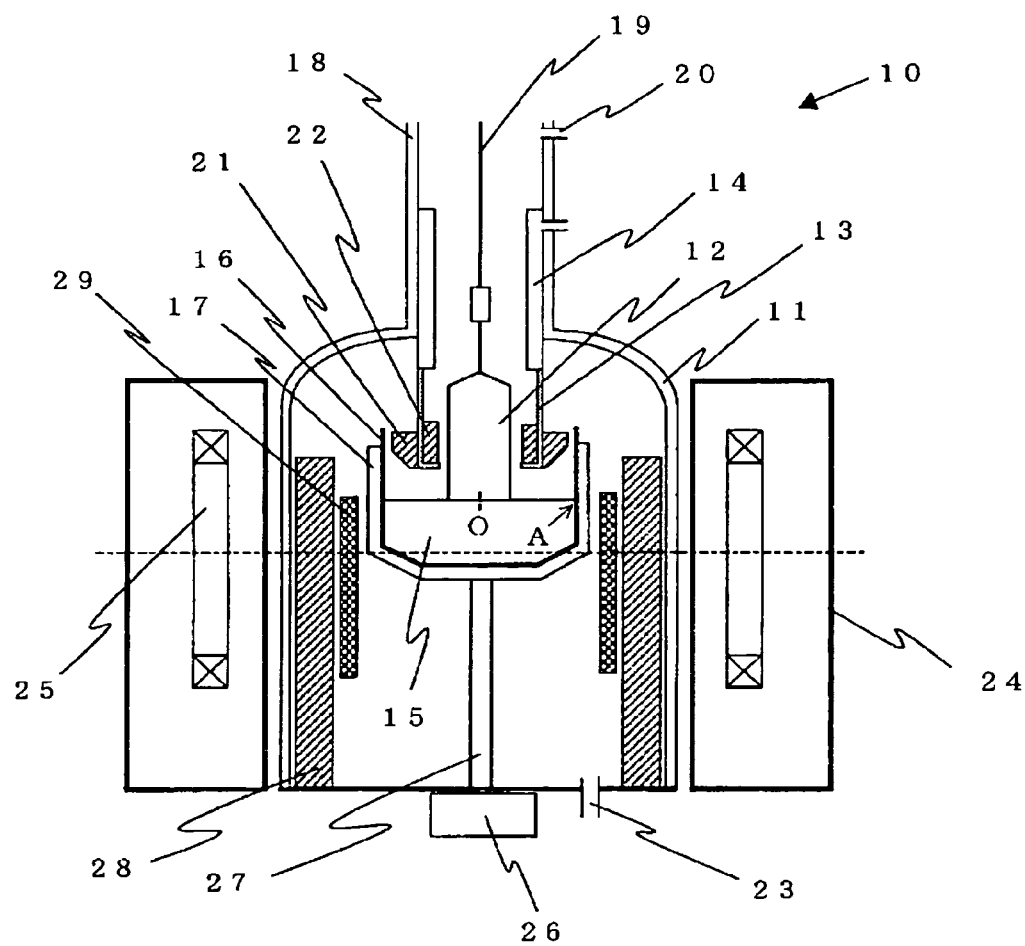
FIG. 1 is a schematic view of a single-crystal manufacturing apparatus which can be used in a method of manufacturing a single crystal according to the present invention.
Figure 2:
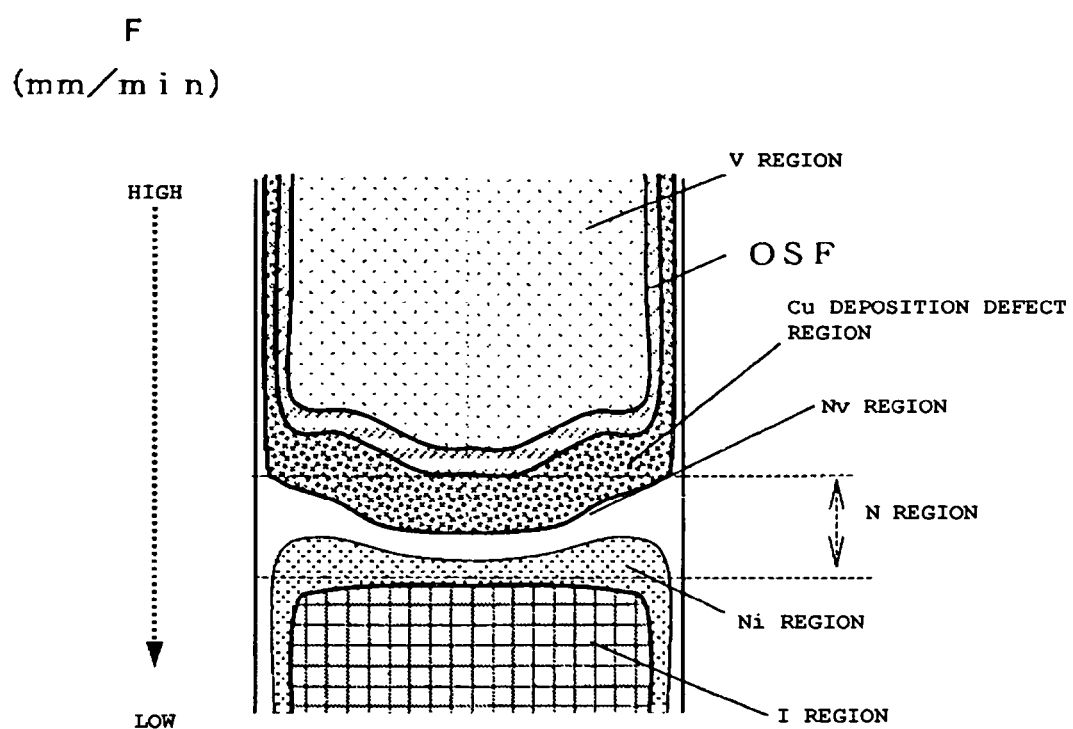
FIG. 2 is a distribution map of a grown-in defect.

The present invention will now be explained hereinafter.

Since, a silicon single crystal having an N region in particular must be pulled while controlling a pulling rate F (mm/min) in a very narrow range, stabilizing a ratio F/Gc (mm$^2$/° C.·min) of the pulling rate F (mm/min) and a crystal temperature gradient Gc (° C./mm) at a central part of the crystal is important, namely, a fluctuation in F/Gc (mm$^2$/° C.·min) with time must be eliminated. A factor obstructing stabilization of this F/Gc (mm$^2$/° C.·min) is mainly a behavior of a melt convection, and stabilizing a fluctuation in F/Gc (mm$^2$/° C.·min) with time is difficult in case of the CZ method of applying no magnetic field, and uniformly obtaining a desired defect quality in a growth direction is hard.

On the other hand, according to, e.g., an HMCZ method, a heat convection of a melt can be suppressed, a time fluctuation in a temperature near a solid-liquid interface (a temperature near a melt surface) of a single crystal to be pulled can be reduced, and a time fluctuation in F/Gc (mm$^2$/° C.·min) can be consequently stabilized. However, when the heat convection of the melt to be suppressed by the HMCZ method is not appropriate, the time fluctuation in the temperature near the melt surface cannot be sufficiently suppressed, and a crystal temperature gradient Gc (° C./mm) near the solid-liquid interface at a central part of the crystal cannot be stabilized in some cases. Additionally, in this case, a fluctuation range of a crystal diameter of the single crystal to be pulled is increased, and an amplitude range of the pulling rate F (mm/min) rises in order to suppress this increase. As a result, a desired defect region cannot be uniformly formed in a crystal growth direction.

Further, in case of a hot zone having a rapid cooling structure in particular, solidification often occurs during single-crystal growth, which obstructs a success rate of single-crystallization.

These problems are those which remarkably occur when pulling a large-diameter single crystal having a diameter of 200 mm or above, especially 300 mm or above.

Thus, the present inventors have been repeatedly dedicated to examinations to develop a single-crystal manufacturing method which enables manufacturing a single crystal having a desired defect region uniformly formed in a growth direction with higher productivity and a higher production yield. As a result, the present inventors have paid attention to a parameter ΔBr/ΔRc (Gauss/mm) indicative of a radial magnetic field intensity gradient along a direction connecting central points of magnetic field generation coils where an origin O is a central part (a central axis) on a solid-liquid interface of a growing single crystal, ΔBr (Gauss) is a variation in a magnetic field intensity from the origin O to a crucible inner wall on a melt surface, and ΔRc (mm) is a radial distance from the origin O to the crucible inner wall on the melt surface in a Czochralski method of applying a horizontal magnetic field. Further, the present inventors have conceived of enabling easy manufacture of a single crystal having a desired defect region formed in a growth direction with high productivity and a high production yield by pulling the single crystal in such a manner that this ΔBr/ΔRc (Gauss/mm) can fall within an appropriate range, thereby bringing the present invention to completion.

It is to be noted that, as an evaluation method of a fluctuation in a temperature near the melt surface with time, software such as STHAMAS-3D or FEMAG can be used to perform numerical analysis based on calculations, but measuring means such as a two-color temperature gauge can be used to measure a fluctuation in a temperature of the melt near the solid-liquid interface during single-crystal growth.

The present invention will now be explained hereinafter with reference to the accompanying drawings, but the present invention is not restricted thereto.

FIG. 1 is a schematic view of a single-crystal manufacturing apparatus, which can be used for a method of manufacturing a single crystal according to the present invention. Silicon is exemplified as a single crystal.

This single-crystal manufacturing apparatus 10 is an apparatus including a gas flow-guide cylinder 13 having a cylindrical shape suspended from a ceiling of a main chamber 11 to surround a single crystal 12 to be pulled in a single-crystal growth direction, and provided with a cooler 14 at an upper portion of the gas flow-guide cylinder 13. Furthermore, an inner heat shielding member 22 and an outer heat-shielding member 21 are provided at a lower portion of the gas flow-guide cylinder 13. That is, this apparatus is a hot zone having a rapid cooling structure of forcibly cooling the crystal.

Moreover, a quartz crucible 16 containing a raw material melt 15 and a graphite crucible 17 which protects this quartz crucible 16 are supported by a support shaft 27 to allow their rotating/elevating movements by a crucible driving mechanism 26 in the main chamber 11, a pulling chamber 18 in which a grown silicon single crystal 12 is accommodated or from which this single crystal 12 is taken out is connected with an upper portion of these crucibles 16 and 17, and a pulling mechanism (not shown) which pulls the silicon single crystal 12 while being rotated with a wire 19 is provided at an upper portion of the pulling chamber 18.

Additionally, a graphite heater 29, which melts a raw material, is arranged to surround the crucibles 16 and 17. A heat-insulating member 28 is provided outside this graphite heater 29 to surround the periphery thereof in order to prevent heat from the graphite heater 29 from being directly radiated to the main chamber 11.

Further, an inert gas, e.g., Ar can be introduced from a gas introducing opening 20 provided at an upper portion of the pulling chamber 18. A flow of this inert gas is straightened by the gas flow-guide cylinder 13 so that the inert gas can pass through a space between the heat-shielding members 21 and 22 and a surface of the raw material melt 15 (a melt surface) to be discharged from a gas discharge opening 23.

Furthermore, this single-crystal manufacturing apparatus 10 has a structure where coils (magnetic field generation coils) 25 constituting electromagnets of a horizontal magnetic field application device 24 are coaxially arranged to face each other with the crucibles 16 and 17 sandwiched therebetween on the outer side of the main chamber 11 so that a horizontal magnetic field can be applied to the raw material melt 15 in the quartz crucible 16.

Moreover, according to the present invention, such a single-crystal manufacturing apparatus can be used to manufacture the single crystal as follows.

That is, according to the present invention, in the Czochralski method of applying a horizontal magnetic field, the horizontal magnetic field is applied by the horizontal magnetic field application device 24 to pull the single crystal in such a manner that a radial magnetic field intensity gradient ΔBr/ΔRc in the direction connecting the central points of the magnetic field generation coils exceeds 5.5 (Gauss/mm) and becomes 10 (Gauss/mm) or below, where an origin O is a central part of the single crystal 12 on a solid-liquid interface, ΔBr (Gauss) is a variation in a magnetic field intensity from the origin O to a crucible (quartz crucible 16) inner surface A on a melt surface (a surface of the raw material melt 15) (from O to A in FIG. 1), and ΔRc (mm) is a radial distance from the origin O to the crucible inner wall A on the melt surface (from O to A in FIG. 1).

Additionally, as methods of setting this parameter ΔBr/ΔRc (Gauss/mm) to such an appropriate range, there are methods of (1) changing a relative position of a central line (a broken line in FIG. 1) of a magnetic force line distribution and an in-crucible melt surface (a surface of the melt 15 in the quartz crucible 16), (2) changing a distance between the coils 25 constituting the electromagnets, numbers of turns of the coils 25, applied current value of the coils 25, and others.

Further, when the radial magnetic field intensity gradient ΔBr/ΔRc in the direction connecting the central points of the magnetic field generation coils is set to exceed 5.5 (Gauss/mm) and become 10 (Gauss/mm) or below, the convection of the raw material melt can be appropriately suppressed. Therefore, a fluctuation in a temperature near the crystal solid-liquid interface with time can be kept to a minimum. As a result, the crystal temperature gradient Gc (° C./mm) near the solid-liquid interface at the central part of the crystal is stabilized. Furthermore, a fluctuation in a diameter of the single crystal to be pulled is reduced, and an amplitude range of the pulling rate F (mm/min) is also decreased. Therefore, the single crystal having the desired defect region can be readily manufactured in the crystal growth axis direction.

Moreover, the method of manufacturing the single crystal according to the present invention is particularly effective when pulling the silicon single crystal having the N region with a narrow manufacture margin. That is, according to the present invention, when pulling the silicon single crystal, an average value of the pulling rate F (mm/min) can be controlled to fall within the range of ±0.01 (mm/min) with respect to an average value of a critical rate at which an OSF is annihilated at a center of a crystal bulk, and a diameter of the single crystal during a pulling operation can be also controlled to fall within the range of ±1% or below of a target value.

It is to be noted that, in case of growing the single crystal based on the Czochralski method of applying a horizontal magnetic field like Patent Document 1, when the radial magnetic field intensity gradient ΔBr/ΔRc in the direction connecting the central points of the magnetic field generation coils is equal to or below 5.5 (Gauss/mm), there is a problem that a fluctuation in a temperature near the crystal solid-liquid interface with time becomes too large even though a magnetic field intensity is high. On the other hand, when the radial magnetic field gradient ΔBr/ΔRc in the direction connecting the central points of the magnetic field generation coils exceeds 10 (Gauss/mm), the pulling rate F (mm/min) when pulling the single crystal having the N region is reduced, thereby disadvantageously decreasing productivity.

Moreover, in such a hot zone having the rapid cooling structure as shown in FIG. 1, solidification quite often occurs during crystal growth, which becomes a problem. In particular, this problem becomes prominent in case of a large-diameter single crystal with a diameter of 300 mm or above which is pulled by using the quartz crucible 16, which contains the melt 15 therein and has a diameter of 24 inches (600 mm) or above. Such occurrence of solidification is an obstacle of single-crystallization, thus leading a reduction in a production yield of the single crystal. However, appropriately setting the radial magnetic field intensity gradient ΔBr/ΔRc in the direction connecting the central points of the magnetic field generation coils enables sufficiently suppressing occurrence of solidification, thereby increasing a success rate of single-crystallization.

Therefore, according to the present invention, the single crystal having the desired defect region can be readily manufactured with high productivity and a high production yield.

Additionally, when pulling the single crystal, it is preferable to set a magnetic field intensity Bo at the origin O of the central part of the crystal solid-liquid interface to fall within the range of 2500 (Gauss) to 5500 (Gauss). As a result, the single crystal having the desired defect region can be pulled at a higher growth rate. The productivity of the single crystal having the desired defect region can be consequently increased.

Incidentally, it is known that the rate of pulling the single crystal having the desired defect region becomes relatively low under a low-magnetic field intensity condition where the magnetic field intensity Bo is less than 2500 (Gauss). Further, the present inventors have discovered that the same result can be obtained under a high-magnetic field intensity condition where the magnetic field intensity Bo exceeds 5500 (Gauss).

Furthermore, in the present invention, it is preferable to control the ratio F/Gc (mm$^2$/° C.·min) of the pulling rate F (mm/min) and the crystal temperature gradient Gc (° C./mm) at the central part of the crystal near the solid-liquid interface in such a manner that the single crystal to be pulled has a desired defect region and to also control a difference ΔG=|Gc−Ge| between the temperature gradient Gc (° C./mm) at the crystal central part near the solid-liquid interface and a temperature gradient Ge (° C./mm) at a crystal peripheral part near the solid-liquid interface to become 5° C./mm or below. Reducing the difference ΔG between the temperature gradient Gc (° C./mm) at the crystal central part near the solid-liquid interface and the temperature gradient Ge (° C./mm) at the crystal peripheral part near the solid-liquid interface in this manner enables easily producing the single crystal having the desired defect region formed in the entire region in the crystal diameter direction.

The present invention will be more specifically explained based on examples and comparative examples, the present invention is not restricted thereto.

EXAMPLES

Comparative Examples

A single-crystal manufacturing apparatus based on a horizontal magnetic field applying CZ method (an HMCZ method) depicted in FIG. 1 was prepared. Moreover, a quartz crucible having a diameter of 800 mm (32 inches) was disposed to the single-crystal manufacturing apparatus, the quartz crucible was charged with 340 kg of raw material polysilicon, and a diameter of 12 inches (300 mm) N-region single crystal having an orientation <100> was pulled. At this time, the single crystal was manufactured in such a manner that an oxygen concentration becomes 22 to 23 ppma (ASTM' 79).

Additionally, when pulling the single crystal, a radial magnetic field gradient ΔBr/ΔRc in a direction connecting central points of magnetic field generation coils and a magnetic field intensity Bo at an origin O at a central part of a crystal solid-liquid interface were controlled based on combinations shown in Table 1 (Examples 1 to 11, Comparative Examples 1 to 6). Further, an average value of a pulling rate F (mm/min) was controlled to fall within the range of ±0.01 (mm/min) with respect to a critical rate at which an OSF is annihilated (becomes an N region) at a center of a crystal bulk and which is a rate realizing a Cu-deposition-defect-free region.

Table 1 shows respective pulling conditions and results.

TABLE 1

| | Magnetic field intensity at central part Bo(Gauss) | Magnetic field intensity on crucible inner wall Br(Gauss) | Variation in magnetic field intensity ΔBr (Gauss) | Radial distance ΔRc(mm) | Magnetic field intensity gradient ΔBr/ΔRc(G/mm) | N region growth rate F(mm/min) | Fluctuation range of crystal diameter ΔD(mm) | Occurrence of solidification |
|---|---|---|---|---|---|---|---|---|
| Example 1 | 2000 | 4240 | 2240 | 400 | 5.6 | 0.35 | Within ±1% | Not occurred |
| Example 2 | 2500 | 4740 | 2240 | 400 | 5.6 | 0.39 | Within ±1% | Not occurred |
| Example 3 | 4000 | 6240 | 2240 | 400 | 5.6 | 0.41 | Within ±1% | Not occurred |
| Example 4 | 4000 | 6800 | 2800 | 400 | 7 | 0.41 | Within ±1% | Not occurred |
| Example 5 | 4000 | 7500 | 3500 | 400 | 8.75 | 0.4 | Within ±1% | Not occurred |
| Example 6 | 4000 | 7960 | 3960 | 400 | 9.9 | 0.4 | Within ±1% | Not occurred |
| Example 7 | 5500 | 7740 | 2240 | 400 | 5.6 | 0.43 | Within ±1% | Not occurred |
| Example 8 | 6000 | 8240 | 2240 | 400 | 5.6 | 0.36 | Within ±1% | Not occurred |
| Example 9 | 4000 | 6520 | 2520 | 450 | 5.6 | 0.4 | Within ±1% | Not occurred |
| Example 10 | 4000 | 7150 | 3150 | 450 | 7 | 0.43 | Within ±1% | Not occurred |
| Example 11 | 4000 | 8500 | 4500 | 450 | 10 | 0.42 | Within ±1% | Not occurred |
| Comparative Example 1 | 2000 | 3500 | 1500 | 400 | 3.75 | — | Out of control | Occurred |
| Comparative Example 2 | 2000 | 6200 | 4200 | 400 | 10.5 | 0.37 | Within ±2% | Not occurred |
| Comparative Example 3 | 4000 | 5500 | 1500 | 400 | 3.75 | 0.37 | Within ±3% | Occurred |
| Comparative Example 4 | 4000 | 8200 | 4200 | 400 | 10.5 | 0.37 | Within ±2% | Not occurred |
| Comparative Example 5 | 4000 | 5800 | 1800 | 450 | 4 | 0.37 | Within ±2% | Partially occurred |
| Comparative Example 6 | 4000 | 8725 | 4725 | 450 | 10.5 | 0.38 | Within ±2% | Not occurred |

According to the above results, in each of Examples 1 to 11 according to the present invention where the radial magnetic field intensity gradient ΔBr/ΔRc in the direction connecting the central points of the magnetic field generation coils was controlled to exceed 5.5 (Gauss/mm) and become 10 (Gauss/mm) or below, a fluctuation in a diameter of the single crystal was able to be controlled within substantially ±1% even though an amplitude range of a growth rate was controlled to a minimum (within ±0.01 (mm/min)). This means that a heat convection of the melt is appropriate and a fluctuation in a temperature near the crystal solid-liquid interface with time is small. Further, although a hot zone having a rapid cooling structure was used, solidification hardly occurred during a pulling operation of the crystal.

Furthermore, in each of Examples 2 to 7 and 9 to 11 where the magnetic field intensity Bo at the origin O was controlled to fall within the range of 2500 (Gauss) to 5500 (Gauss), the single crystal having the N region was successfully grown at a relatively high pulling rate F (mm/min) which is 0.39 mm/min or above.

Moreover, crystallinity evaluation of a crystal body portion of 10 cm or above was performed with respect to each of Examples 1 to 11 and Comparative Examples 1 to 6.

An evaluation method for crystallinity evaluation is as follows.
(1) FPD (the V Region) and LEP (the I Region) Examinations:

A slab sample having a thickness of approximately 2 mm was taken from each region of a crystal body portion of 10 cm or above, surface grinding was performed, then secco etching (without agitation) was carried out for 30 minutes, and a sample in-plane density was measured.
(2) Examination of an OSF Region:

A slab sample having a thickness of approximately 2 mm was taken from each region of the crystal body portion of 10 cm or above, a heat treatment was performed in a Wet-$O_2$ atmosphere at 1100° C. for 100 minutes, and a sample in-plane density was measured.

(3) Examination of Defects Caused Due to Cu Deposition Treatment:

After processing into a mirror-finished wafer, a thermal oxide film was formed on the wafer surface, then Cu deposition treatment was carried out, and a distribution status of each oxide film defect was confirmed.

A processing method is as follows.
1) Oxide film: 25 nm
2) Electric field intensity: 6 MV/cm
3) Energization time: 5 minutes
(4) Examination of Oxide Film Breakdown Voltage Characteristics:

Each single crystal was processed into a mirror-finished wafer, and oxide film breakdown voltage characteristics were evaluated.

The measuring condition of C-mode is as follows.
1) Oxide film: 25 nm
2) Measured electrode: Phosphor-doped polysilicon
3) Electrode area: 8 $mm^2$
4) Judgmental current: 1 $mA/cm^2$ As results of the crystallinity evaluation, it was revealed that the single crystal in each of Examples 1 to 11 has excellent oxide film breakdown voltage characteristics and also has the N region, which is free from FPD, LEP, OSF, and Cu deposition defects.

On the other hand, in each of Comparative Examples 1 to 6, the diameter control varies, the pulling rate is slow and fluctuates, and an FPD or an LEP was observed in a part of the crystal.

The present invention is not limited to the embodiment described above. The above-described aspects are mere examples and those having substantially the same structure as technical ideas described in the appended claims and providing the similar functions and advantages are included in the scope of the present invention.

The invention claimed is:
1. A method of manufacturing a single crystal based on a Czochralski method of applying a horizontal magnetic field, wherein the single crystal is pulled in such a manner that a radial magnetic field intensity gradient ΔBr/ΔRc in a direction connecting central points of magnetic field generation coils exceeds 5.5 (Gauss/mm) and becomes 10 (Gauss/mm) or below where an origin O is a central part of the single crystal on a solid-liquid interface, ΔBr (Gauss) is a variation in a magnetic field intensity of the horizontal magnetic field from the origin O to a crucible inner wall on a surface of a melt, and ΔRc (mm) is a radial distance from the origin O to the crucible inner wall on the surface of the melt.

2. The method of manufacturing a single crystal according to claim 1, wherein a magnetic field intensity Bo at the origin O of the central part of the crystal solid-liquid interface is set to fall within the range of 2500 (Gauss) to 5500 (Gauss) when pulling the single crystal.

3. The method of manufacturing a single crystal according to claim 1, wherein an average value of a pulling rate F (mm/min) is controlled to fall within the range of ±0.01 (mm/min) with respect to an average value of a critical rate at which an OSF is annihilated at a center of a crystal bulk and a diameter of the single crystal which is in a pulling operation is controlled to fall within the range of ±1% of a target value when pulling the single crystal.

4. The method of manufacturing a single crystal according to claim 2, wherein an average value of a pulling rate F (mm/min) is controlled to fall within the range of ±0.01 (mm/min) with respect to an average value of a critical rate at which an OSF is annihilated at a center of a crystal bulk and a diameter of the single crystal which is in a pulling operation is controlled to fall within the range of ±1% of a target value when pulling the single crystal.

5. The method of manufacturing a single crystal according to claim 1, wherein a ratio F/Gc ($mm^2/°$ C.×min) of the pulling rate F (mm/min) and a crystal temperature gradient Gc (° C./mm) of a crystal central part near the solid-liquid interface is controlled and a difference ΔG=|Gc-Ge| between the temperature gradient Gc (° C./mm) of the crystal central part near the solid-liquid interface and a temperature gradient Ge (° C./mm) of a crystal peripheral part near the solid-liquid interface is controlled to become 5° C./mm or below, in such a manner that the single crystal to be pulled has a desired defect region.

6. The method of manufacturing a single crystal according to claim 2, wherein a ratio F/Gc ($mm^2/°$ C.×min) of the pulling rate F (mm/min) and a crystal temperature gradient Gc (° C./mm) of a crystal central part near the solid-liquid interface is controlled and a difference ΔG=|Gc-Ge| between the temperature gradient Gc (° C./mm) of the crystal central part near the solid-liquid interface and a temperature gradient Ge (° C./mm) of a crystal peripheral part near the solid-liquid interface is controlled to become 5° C./mm or below, in such a manner that the single crystal to be pulled has a desired defect region.

7. The method of manufacturing a single crystal according to claim 3, wherein a ratio F/Gc ($mm^2/°$ C.×min) of the pulling rate F (mm/min) and a crystal temperature gradient Gc (° C./mm) of a crystal central part near the solid-liquid interface is controlled and a difference ΔG=|Gc-Ge| between the temperature gradient Gc (° C./mm) of the crystal central part near the solid-liquid interface and a temperature gradient Ge (° C./mm) of a crystal peripheral part near the solid-liquid interface is controlled to become 5° C./mm or below, in such a manner that the single crystal to be pulled has a desired defect region.

8. The method of manufacturing a single crystal according to claim 4, wherein a ratio F/Gc ($mm^2/°$ C.×min) of the pulling rate F (mm/min) and a crystal temperature gradient Gc (° C./mm) of a crystal central part near the solid-liquid interface is controlled and a difference ΔG=|Gc-Ge| between the temperature gradient Gc (° C./mm) of the crystal central part near the solid-liquid interface and a temperature gradient Ge (° C./mm) of a crystal peripheral part near the solid-liquid interface is controlled to become 5° C./mm or below, in such a manner that the single crystal to be pulled has a desired defect region.

9. The method of manufacturing a single crystal according to claim 1, wherein a crucible, which contains the melt and has a diameter of 24 inches (600 mm) or above is used.

10. The method of manufacturing a single crystal according to claim 2, wherein a crucible, which contains the melt and has a diameter of 24 inches (600 mm) or above is used.

11. The method of manufacturing a single crystal according to claim 3, wherein a crucible, which contains the melt and has a diameter of 24 inches (600 mm) or above is used.

12. The method of manufacturing a single crystal according to claim 4, wherein a crucible, which contains the melt and has a diameter of 24 inches (600 mm) or above is used.

13. The method of manufacturing a single crystal according to claim 5, wherein a crucible, which contains the melt and has a diameter of 24 inches (600 mm) or above is used.

14. The method of manufacturing a single crystal according to claim 6, wherein a crucible, which contains the melt and has a diameter of 24 inches (600 mm) or above is used.

15. The method of manufacturing a single crystal according to claim 7, wherein a crucible, which contains the melt and has a diameter of 24 inches (600 mm) or above is used.

16. The method of manufacturing a single crystal according to claim 8, wherein a crucible, which contains the melt and has a diameter of 24 inches (600 mm) or above is used.

17. The method of manufacturing a single crystal according to claim 1, wherein the single crystal is silicon.

18. The method of manufacturing a single crystal according to claim 16, wherein the single crystal is silicon.

* * * * *